(12) United States Patent
Muradali et al.

(10) Patent No.: US 6,587,981 B1
(45) Date of Patent: Jul. 1, 2003

(54) INTEGRATED CIRCUIT WITH SCAN TEST STRUCTURE

(75) Inventors: Fidel Muradali, Mountain View, CA (US); Neal C. Jaarsma, Corvallis, OR (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/450,469

(22) Filed: Nov. 29, 1999

(51) Int. Cl.[7] .................... G01R 31/28; G01R 31/3185
(52) U.S. Cl. ........................ 714/726; 714/733
(58) Field of Search ................. 714/724–727, 714/729, 733

(56) References Cited

U.S. PATENT DOCUMENTS

| | | | | |
|---|---|---|---|---|
| 4,872,169 A | * | 10/1989 | Whetsel, Jr. ................. 714/727 |
| 5,477,545 A | * | 12/1995 | Huang ..................... 324/158.1 |
| 5,642,363 A | * | 6/1997 | Smith ......................... 714/729 |
| 5,719,878 A | * | 2/1998 | Yu et al. ..................... 327/202 |
| 5,828,579 A | * | 10/1998 | Beausang ..................... 716/2 |
| 5,862,152 A | * | 1/1999 | Handly et al. ............... 714/727 |
| 6,158,032 A | * | 12/2000 | Currier et al. .............. 714/726 |
| 6,324,614 B1 | * | 11/2001 | Whetsel ..................... 710/130 |
| 6,324,662 B1 | * | 11/2001 | Haroun et al. .............. 714/724 |

* cited by examiner

Primary Examiner—Albert DeCady
Assistant Examiner—Cynthia Britt

(57) ABSTRACT

Scan path structures are provided for integrated circuits which contain one or more cores or levels of sub-cores embedded within the cores. Circuitry is provided to permit scan testing of scan elements, such as scan wrapper cells and scan chains, in the cores and sub-cores by providing scan paths which share access to limited numbers of scan test ports of the integrated circuit under test. This solves the problem of having sufficient scan ports at the integrated circuit boundaries for the increasingly higher number of scan paths which require access to these scan ports.

25 Claims, 9 Drawing Sheets

INTEGRATED CIRCUIT WITH SCAN TEST STRUCTURE

TECHNICAL FIELD

The present invention relates generally to scan testing of integrated circuit and more particularly to scan testing of single-level or multi-level nested integrated circuits.

BACKGROUND ART

Integrated circuits (ICs) generally and application specific integrated circuits (ASICs) specifically can be programmed to perform any number of functions. In order to test them, circuitry separate from the programmed functions is included specifically for testing. The test circuitry requires input and output ports that are separate from the input and output ports of the programmed functions. During normal operations, the functional circuitry operates, and during test operations, a separate set of test circuitry using the test inputs and outputs are used.

Cores are also becoming more common as computer-aided drawing (CAD) tools are used to design complete circuits. However, CAD tools have a capacity that is a fraction of the size of a completed circuit. Such large projects can be simplified when designed in terms of smaller cores and sub-cores rather than as one monolithic chip. Splitting a design into several smaller pieces simplifies the design and enables each part to be individually tested, the final product consisting of multiple interconnected core sections.

Additionally, the purchase of intellectual property frequently sees individual cores and sub-cores being purchased from outside vendors and being embedded into a chip rather than whole chips designs.

Each core and sub-core has its own test input and output ports and needs to be tested individually, without interference from adjacent cores or sub-cores, as well as part of the whole system. These test ports are part of a test-related element called a "wrapper cell," the circuitry attached to the functional elements of a core to provide paths for test data to flow. A wrapper cell normally consists of a flip-flop and a multiplexer, and is able to function in a functional mode and a test mode. In the functional mode, the wrapper cell is transparent and normal functional signals are passed through the multiplexer to the functional core. In the test mode, the wrapper cell changes the input signal causing the test input to be passed through the multiplexer.

Many wrapper cells are chained together in a chip register in order to scan test data in and out of the circuit in a method referred to as "scan testing". There are many different schemes for scan testing, but the predominant method is the monolithic scan path approach where the scan elements, such as the wrapper cell and scan chains, are connected in a straight-path, serial manner. While this has the ability to send and receive test data from every core and sub-core in a chip, it is also slow since testing one scan element in the chain requires moving data through every scan element in the serial chain. Further, it is not possible with this approach to select specific internal scan chains or subsets of internal scan chains for loading or unloading test data which makes it difficult to pinpoint problems.

Another approach is to connect scan-in ports directly to scan-in terminals for each core. This makes it possible to select specific internal scan chains or subsets of internal scan chains, however, this is difficult to implement because the total number of available scan ports at the integrated circuit chip boundary typically are exceeded by the total number of scan paths requiring access to these ports, and further because impractical amounts of wiring is required.

As the complexity of integrated circuits increase and more system-on-a-chip devices come into use, the need to find an efficient method for the scan testing of single-level and multi-level integrated circuits becomes more and more imperative.

DISCLOSURE OF THE INVENTION

The present invention provides a scan path structure for integrated circuits which contain one or more cores or levels of sub-cores embedded within the costs. Circuitry is provided to permit scan testing of scan elements, such as scan wrapper cells and scan chains, in the cores and sub-cores by providing scan paths which share access to limited numbers of scan test ports of the integrated circuit under test. This solves the problem of having insufficient scan ports at the integrated circuit boundaries for the increasingly higher number of scan paths which require access to these scan ports.

The present invention provides a reconfigurable scan path structure for integrated circuits which contain one or more cores or levels of sub-cores embedded within the cores. Logic circuitry is provided to permit scan testing of scan elements, such as scan wrapper cells and scan chains, in the cores and sub-cores by providing alternate scan paths which share access to limited numbers of scan test ports of the integrated circuit under test. This solves the problem of having sufficient scan ports at the integrated circuit boundaries for the increasingly higher number of scan ports which require access to these scan ports.

The present invention further provides a reconfigurable scan path structure for integrated circuits having global scan-in buses and which contain one or more cores or levels of sub-cores embedded within the cores. Logic circuitry is connected to the global buses which pass through the cores and sub-cores requiring scan access and allow connections to permit scan testing of scan elements in the cores and sub-cores by providing alternate scan paths which share access to limited data test ports of the integrated circuit under test. This solves the problem of having insufficient scan ports at the integrated circuit boundary for the increasingly higher number of scan paths which require access to these scan ports.

The present invention further provides a reconfigurable scan path structure for integrated circuits which do not have global scan-in buses and which contain one or more cores of levels of sub-cores embedded within the cores. Logic circuitry is provided to permit scan testing of scan elements in the cores and sub-cores by providing scan-in data through the logic circuitry and by providing alternate scan paths which share access to limited data test ports of the integrated circuit under test. This solves the problem of having sufficient scan ports at the integrated circuit boundary for the increasingly higher number of scan paths which require access to these scan ports and eliminates the need for a global bus.

The present invention further provides a reconfigurable scan path structure for integrated circuit which contain one or more cores, sub-cores embedded within the cores, or multi-levels of sub-cores within sub-cores. Logic circuitry is provided to permit scan testing of scan elements in the cores, sub-cores and sub-sub-cores by providing alternate scan paths which share access to limited data test ports of the integrated circuit under test. This solves the problem of having insufficient scan ports at the integrated circuit boundary for the increasingly higher number of scan paths which require access to these scan ports, and further increases the efficiency of scan testing.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
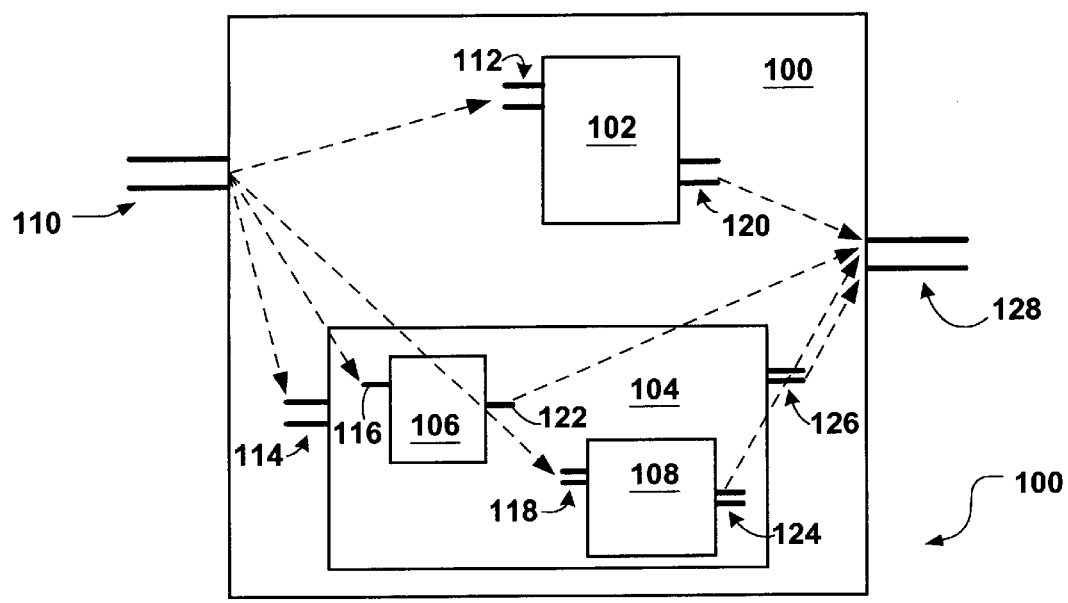
FIG. 1 (PRIOR ART) is a diagram showing the basic organization of a typical system level integration device.

Organization:

Referring now to FIG. 1 (PRIOR ART), therein is shown a diagram showing the basic organization of an application-specific integrated circuit (ASIC) chip 100. The ASIC chip 100 as an example has two main cores which are an A core 102 and a B core 104. The B core 104 has two sub-cores, B.1 sub core 106 and B.2 sub-core 108. Hereinafter, the elements associated with the respective cores and sub-cores will be preceded by the appropriate core or sub-core designation; i.e., A, A.1, A.2, B, B.1, or B.2. The first and second items of a designation will be indicated by the designation and number; i.e., A.1, B.1, etc. It will be understood that there may be even further levels but the levels herein described are typical.

For testing purposes, each section has connections for scanning in test data or information and for scanning out test results or information. These connections are referred to as scan-in (SI) and scan-out (SO) ports and terminals. The ASIC chip 100 has two SI ports 110 which are connected to the inputs of each of the cores and sub-cores. There are A SI1 and S12 terminals 112, B SI1 and SI2 terminals 114, a B.1 SI terminal 116, and B.2 SI1 and SI2 terminals 118. The ASIC chip 100 also has two SO ports 128 which are connected to the outputs of each of the cores and sub-cores. There are two A SO terminals 120, two B SO terminals 126, one B.1 SO terminal 122, and two B.2 SO terminals 124.

The term "port" for the chip is equivalent to the term "terminal" for a core or sub-core.

If the ASIC 100 were a system-level-integration (SLI) device, or system on a chip, it would be described as containing four embedded cores, which are the two main cores and the two sub-cores. The sub-cores are said to be "nested" since they are embedded in one of the main cores. While not shown, the sub-cores could have sub-sub-cores and multi-levels of sub-cores within sub-cores.

An embedded core is called the "child" of the logic in which it is contained. Thus, the B.1 sub-core 106 is the child of B core 104, and also, B core 104 is the child of the ASIC logic on the ASIC chip 100. Similarly, B core 104 is the "parent" of the B.1 and B.2 sub-cores 106 and 108.

A "parent" core is the core containing common elements; e.g., the B core 104 is the parent core for the B.1 and B.2 sub-cores 106 and 108.

A "host" core is the particular core being targeted for test, or the "host" for the test data.

The level of integration of a core is a measure of the number of parents it possesses in the hierarchy. For example, the A core 102 and the B core 104 possess only the ASIC chip 100 as a parent and are in the first level of integration while the B.1 and B.2 sub-cores 106 and 108 possess both the B core 104 and the ASIC chip 100 as parents and are in the second level of integration.

Figure 2:
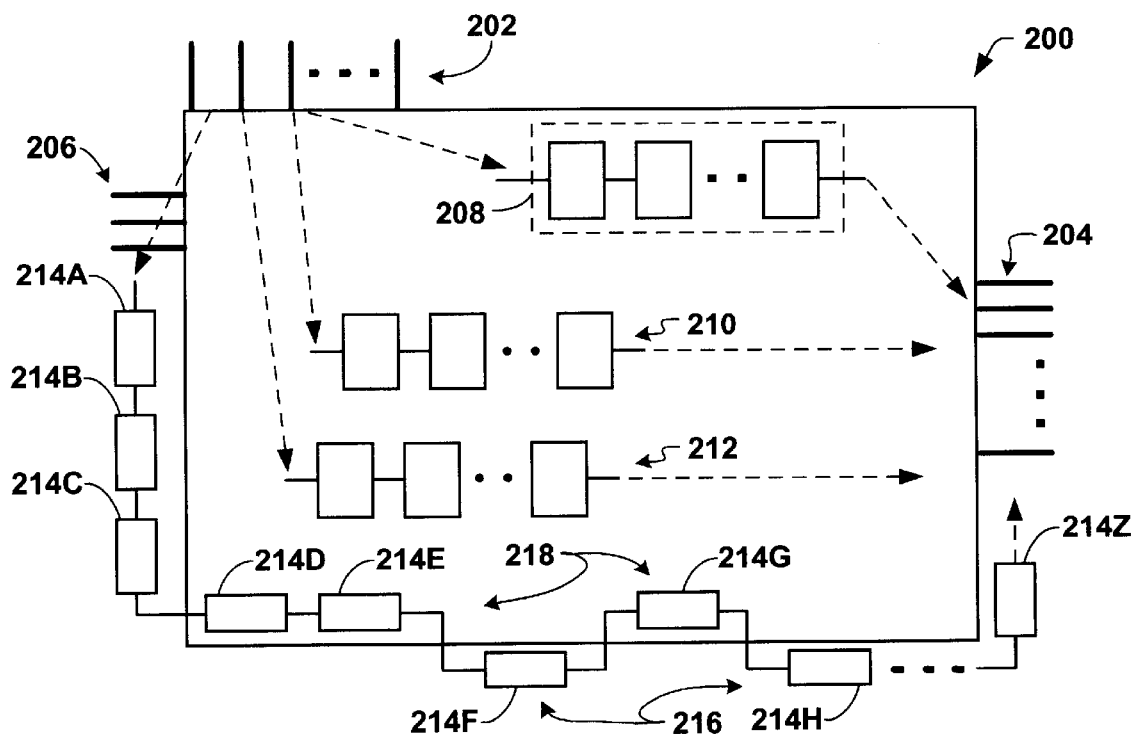
FIG. 2 (PRIOR ART) is a diagram showing different test structures in and on a typical core.

Referring now to FIG. 2 (PRIOR ART), therein is shown a diagram showing different scan elements used in scan testing in and on a typical core 200. The core 200 is represented as a block with a plurality of core SI terminals 202 and core SO terminals 204, and asynchronous system clock inputs 206.

The internal structure of the core 200 consists of a small number of scanable control register 208 and two internal scan chains 210 and 212. The scan chains are composed of memory elements (not shown) associated with the internal logic of the core 200. The SI terminals 202 are connected to the inputs of the control register 208 and both of the internal scan chains 210 and 212. The outputs of the control register 208 and both of the internal scan chains 210 and 212 are connected to the SO terminals 204.

In order to provide a path for test data to flow, a scan test wrapper cell element, or wrapper cell 214, is attached to the core 200. A wrapper is a single cell or a chain of cells connected to the inputs and outputs of a core 200 which used to isolate a core from the rest of an integrated circuit during scan testing. Under certain conditions where an input or output terminal respectively inputs or outputs to or from or flip flop with only non-gating logic in test mode (e.g., buffers and/or inverters) in between, the flip flop can serve as a wrapper cell. The wrapper cell 214 is connected in a scan chain of a plurality of wrapper cell segments 214A through 214Z and may be a single continuous chain that may be segmented into smaller registers, such as the external and internal wrapper cell sections 216 and 218, respectively. The SI terminals 202 are connected to the input of the wrapper cell 214 and the output of the wrapper cell 214 is connected to the SO terminal 204. The wrapper cells and scan chains may generically be referred to as scan elements.

Figure 3A:
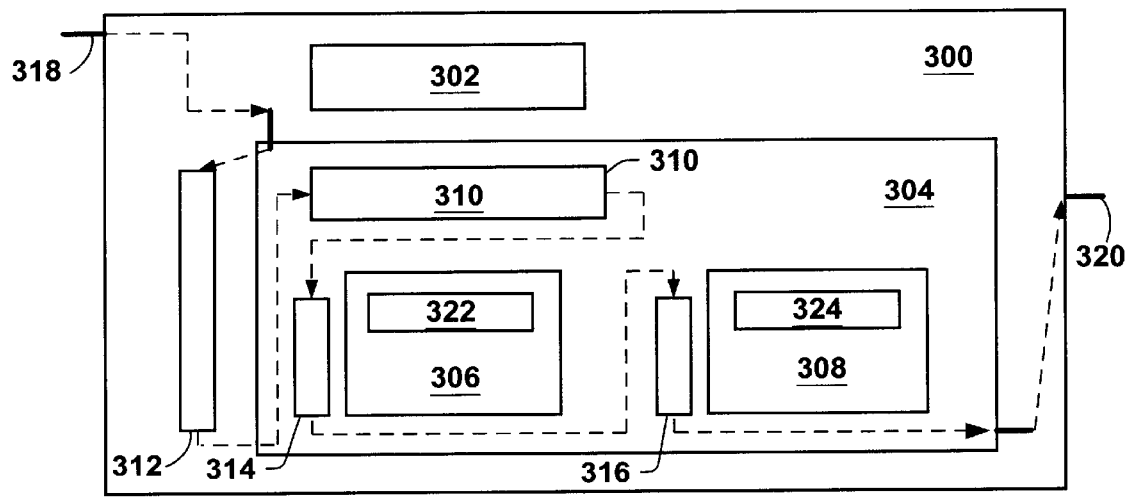
FIGS. 3A–3D are scan chain configurations for testing different configuration cores according to the present invention.
Figure 3B:
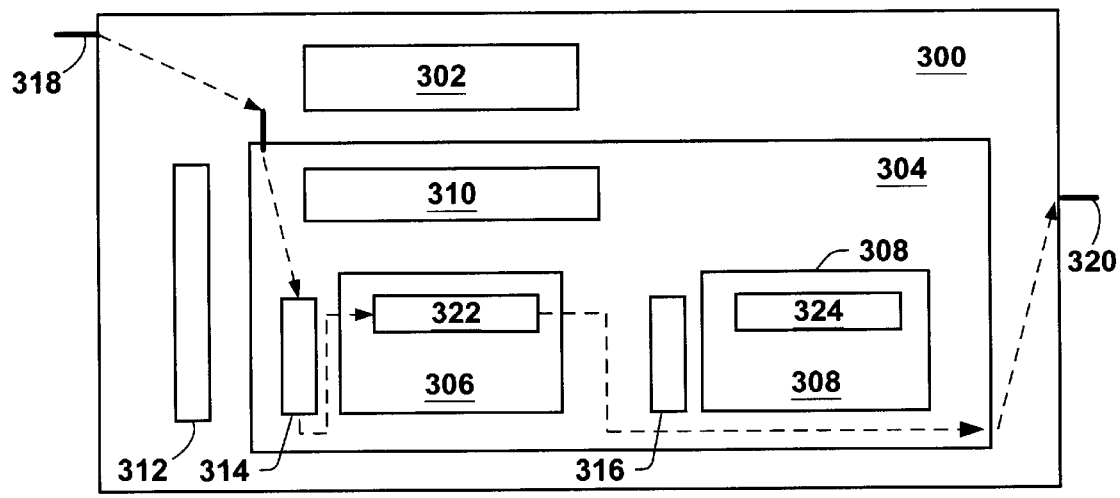
Figure 3C:
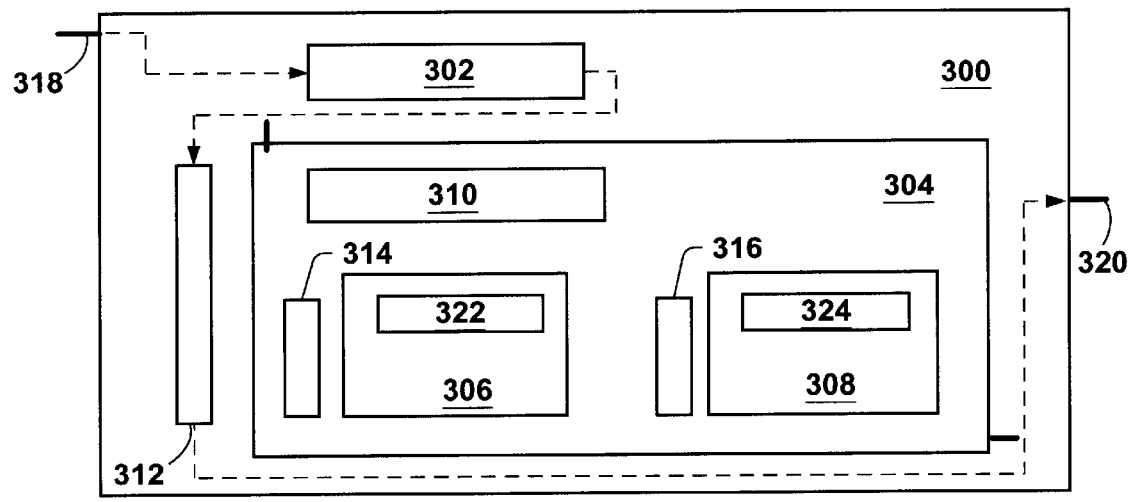

Referred now to FIGS. 3A–3D, therein are shown the chain configurations for required tests of an ASIC chip. In FIGS. 3A–3C, the ASIC chip 300 has an ASIC scan chain 302 and an A core 304. The A core 304 has A.1 and A.2 sub-cores 306 and 308, and an A internal scan chain 310. The A core 304 further has an A wrapper cell 312, and A.1 and A.2 wrapper cells 314 and 316. Additionally, the respective A.1 and A.2 sub-cores 306 and 308 have respective A.1 and A.2 internal scan chains 322 and 324.

In FIG. 3A, the above elements are connected together serially to form a test chain for testing the A core 304. The ASIC chip 300 has a chip SI port 318 that is connected to the A core 304 and, through A core 304, to the wrapper cell 312. The A wrapper cell 312 is connected to the A internal scan chain 310. The A internal scan chain 310 is connected to the A.1 wrapper cell 314. The A.1 wrapper cell 314 is connected to the A.2 wrapper cell 316. The output of the A.2 wrapper 316 is connected to the chip SO port 320.

In FIG. 3B, the above elements are connected together serially to form a test chain for testing the A.1 sub-core 306. The elements in the circuit shown in FIG. 3B are identical to those in FIG. 3A, but the connections differ. This chain configuration has the chip SI port 318 connected directly to an A core 304 and from there to the A.1 wrapper cell 314. The test path then goes through the A.1 internal scan chain 322, out of both the A.1 sub-core 306 and A core 304, and to the chip SO port 320.

In FIG. 3C, the above elements are connected together serially to form a test chain for testing the top ASIC level. The elements in the circuit shown in FIG. 3C are identical to those in FIG. 3A., but the connections differ. The chain configuration has the chip SI port 318 connected to the ASIC chain 302, from there to the A wrapper cell 312, and to the chip SO port 320.

Figure 3D:
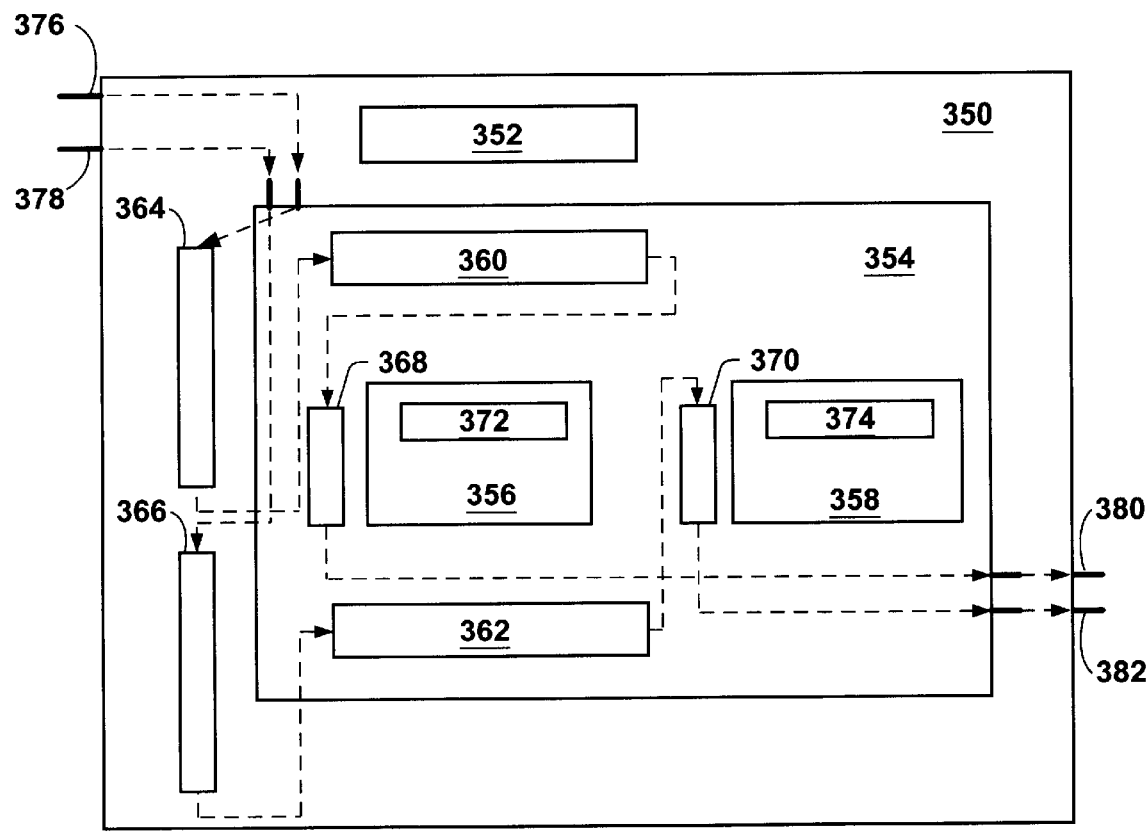

Referring now to FIG. 3D, therein is shown a test chain for testing an A core 354 inside of the ASIC chip 350. The ASIC chip 350 has SI1 and SI2 chip SI ports 376 and 378, SO1 and SO2 chip SO ports 380 and 382, an ASIC chain 352 and an A core 354. The A core 354 also has two sub-cores, A.1 and A.2 sub-cores 356 and 358, and two internal scan chains 360 and 362. The A core 354 has two wrapper cell segments 364 and 366, and sub-cores A.1 and A.2 wrapper cells 368 and 370. Additionally, each sub-core has an internal scan chain, A.1 and A.2 internal scan chains 372 and 374.

The two chip SI ports, ASIC SI1 and SI2 ports 376 and 378, are the starting points for two separate test paths. The first scan path starts at ASIC SI1 port 376 and goes to A core 354, then to the wrapper cell segment 364, through the internal scan chain 360, to the A.1 wrapper cell 368, and out by the ASIC SO1 port 380. The second scan path starts at the SI2 port 378 and goes to the A core 354, then to the wrapper cell segment 366, through the internal scan chain 362, to the A.2 wrapper cell 370, and out by the ASIC SO2 port 382.

Figure 4:
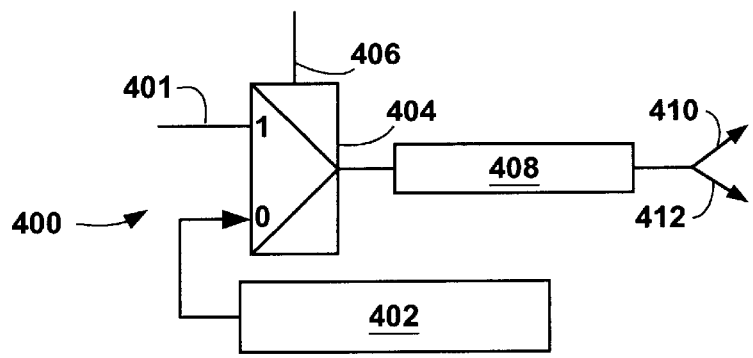
FIG. 4 is a configurable wrapper cell and internal scan chain structure which can be incorporated in the integrated circuit of the present invention.

Referring now to FIG. 4, therein is shown a reconfigurable scan path structure 400 of the present invention which can be incorporated in an integrated circuit and which can support conditional merging with other chains. A host SI bus 401 and a header scan chain 402 are the inputs to "connection logic" which is capable of connecting different inputs and outputs in different combinations in response to select input control signals. In the present invention, the connection logic consists of various combinations of multiplexers although other types of logic would be evident to those skilled in the art.

In FIG. 4, the multiplexer 404 selects between connections under the control signal provided at a host select input 406. The output of the multiplexer 404 is to a host wrapper cell 408. The host wrapper cell 408 is connectable to both a host SO map logic 410 and to a scan-input of the next internal scan chain 412.

Figure 5:
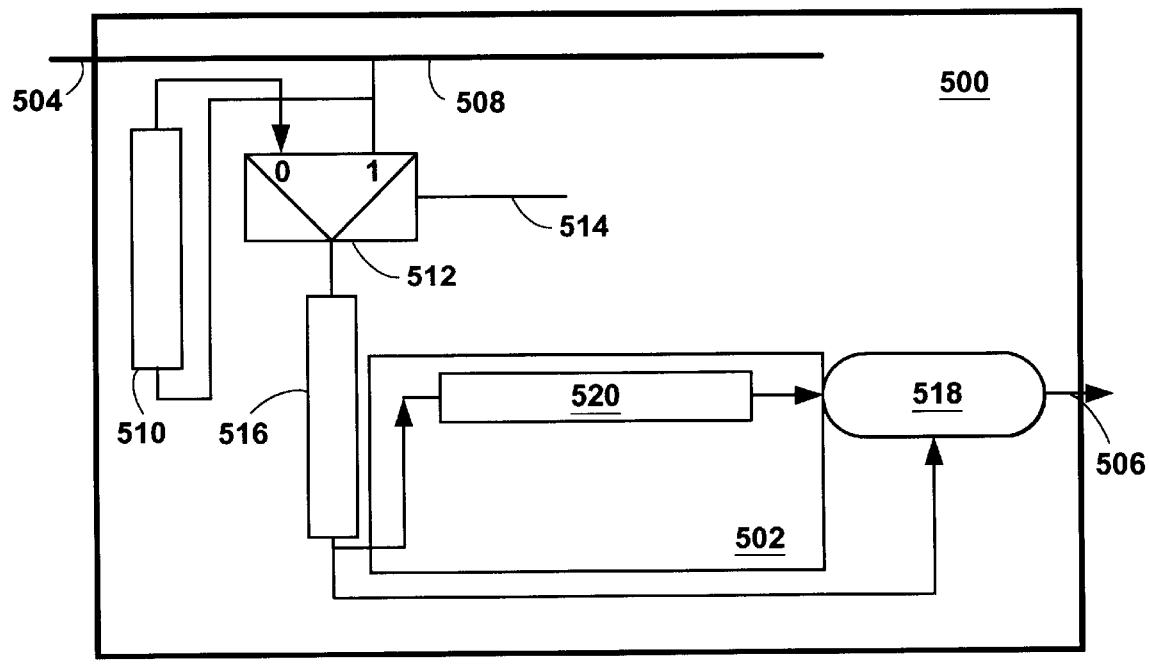
FIG. 5 is how the structure of FIG. 4 is used in an integrated circuit of the present invention.

Referring now to FIG. 5, therein is shown an example of the connectivity of the reconfigurable scan path structure 400 of FIG. 4. An ASIC chip 500 contains an A core 502. The ASIC has a chip SI port 504 and a chip SO port 506. The chip SI port 504 is connectable to both a global SI bus 508 and to the input of an ASIC multiplexer 512. An ASIC scan chain 510 is connectable to the other input of the ASIC multiplexer 512. A select input 514 is also connectable to the ASIC multiplexer 512. The output of the ASIC multiplexer 512 is to an ASIC wrapper cell 516. The ASIC wrapper cell 516 has two outputs, one going directly to ASIC SO mapping logic 518 and the other going into the A core 502 and connecting to an A internal scan chain 520. The output of the A internal scan chain 520 exits A core 502 and connects to the ASIC SO mapping logic 518. The ASIC SO mapping logic 518 connects to the chip SO port 506.

Figure 6:
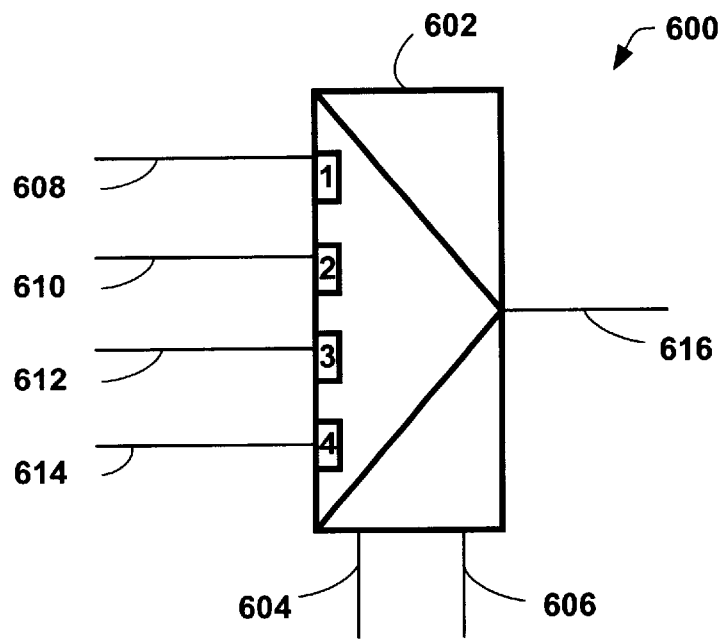
FIG. 6 is a scan-out mapping logic block structure which can be incorporated in the integrated circuit of the present invention.

Referring now to FIG. 6, therein is shown SO mapping logic 600 of the present invention, an example of which is the ASIC SO mapping logic 518. The SO mapping logic 600 is a multiplexer 602 with select inputs 604 and 606, and a number of inputs, such as an ASIC chain/wrapper cell SO input 608, a nest network SO input 610, a previous core SO input 612, and a host core SO input 614. The output of the multiplexer 602 is a mapped SO 616.

Figure 7:
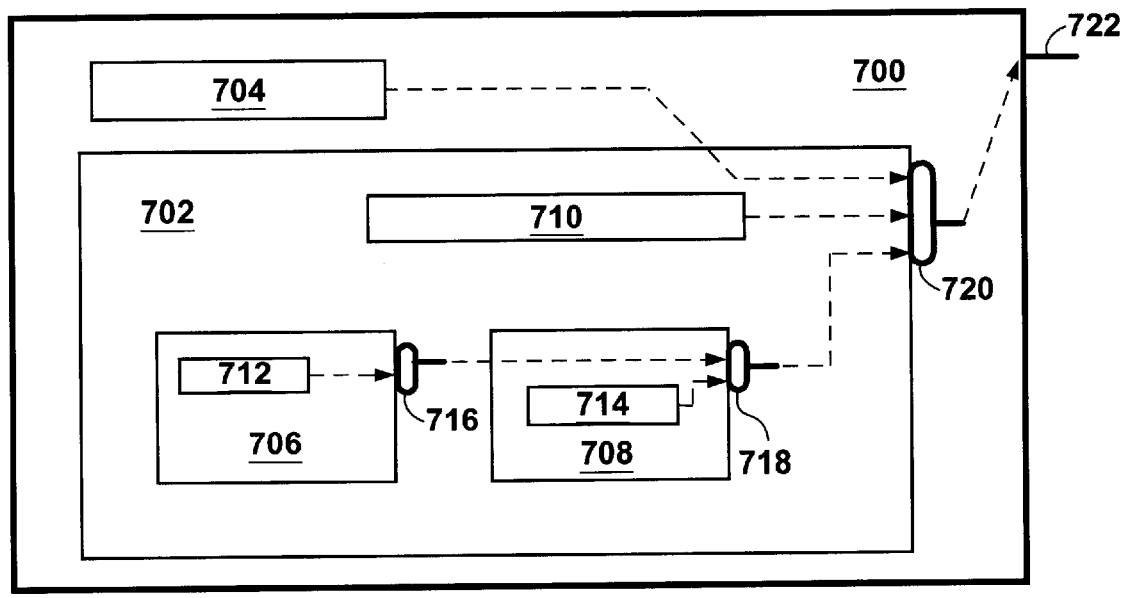
FIG. 7 is how the structure of FIG. 6 is used in an integrated circuit of the present invention.

Referring now to FIG. 7, therein is shown an example of the connectivity of the SO mapping logic 600 of FIG. 6. An ASIC chip 700 consists of an A core 702 and an ASIC internal scan chain 704. The A core 702 has two sub-cores, A.1 and A.2 sub-cores 706 and 708, and an A internal scan chain 710. Each sub-core has its own internal scan chain, A.1 and A.2 internal scan chains 712 and 714. Attached to the output of each core and sub-core is an SO mapping logic block, A.1 SO mapping logic 716, A.2 SO mapping logic 718, and A SO mapping logic 720.

The A SO mapping logic 720 has three inputs. The first input is directly from the ASIC internal scan chain 704. The second input is directly from the A internal scan 710. The third input has two stages. The first stage has the output of the A.1 internal scan chain 712 connecting to the A.1 SO mapping logic 716 and outputting an A.1 mapped SO signal for the A.1 sub-core 706. The second stage has the A.1 mapped SO signal and the output of the A.2 internal scan chain 714 acting as inputs to the A.2 SO mapping logic 718. The output of the A.2 SO mapping logic 718 acts as the third input to the A SO mapping logic 720. The A SO mapping logic 720 outputs a mapped A SO signal to the ASIC chip SO port 722.

Figure 8:
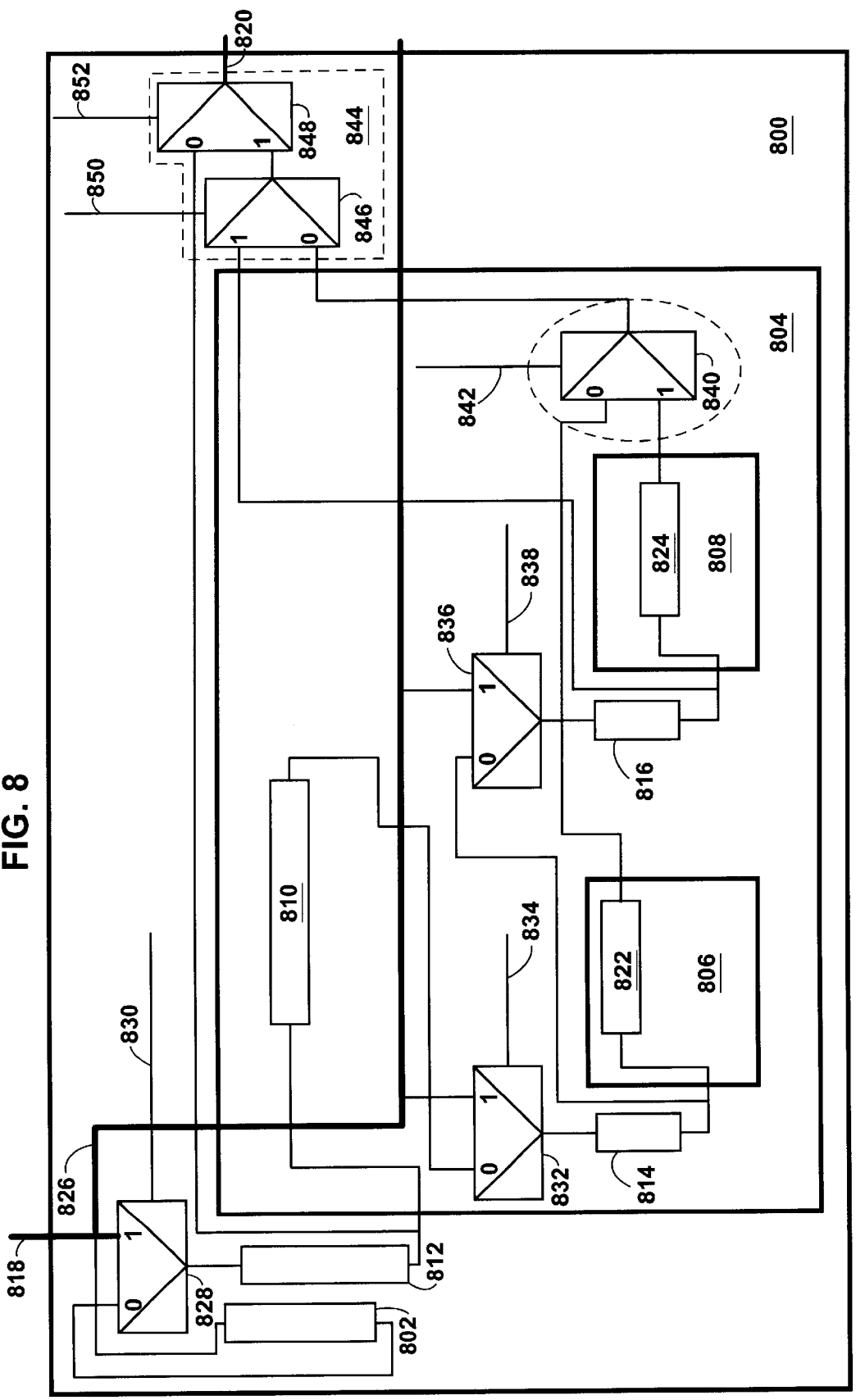
FIG. 8 is an alternate embodiment of the present invention using scan-in multiplexers.

Referring now to FIG. 8, therein is shown an alternate embodiment of the present invention on an ASIC chip having a global scan. An ASIC chip 800 has a chip SI port 818, an chip SO port 820, and ASIC internal scan chain 802, and an A core 804. The A core 804 has two sub-cores, A.1 and A.2 sub-core 806 and 808, an an A internal scan chain 810. The A core 804 has an A wrapper cell 812, and the sub-cores have A.1 and A.2 wrapper cells 814 and 816. Additionally, the sub-cores have A.1 and A.2 internal scan chains 822 and 824.

The chip SI port 818 is connectable to a global scan wire 826 that extends throughout the ASIC chip 800. An A SI multiplexer 828 has the ASIC chain 802 and the global scan bus 826 as inputs and an SI select input 830. The A SI multiplexer 828 is connectable to the A wrapper cell 812. The A wrapper cell 812 is connectable to the A internal scan chain 810. An A.1 SI multiplexer 832 has two inputs, the A internal scan chain 810 and the global scan wire 826, and an A.1-SI select input 834. The A.1 SI multiplexer 832 is connectable to the A.1 wrapper cell 814. The A.1 wrapper cell 814 is connectable to the A.1 internal scan chain 822. The A.2 SI multiplexer 836 has two inputs, the output of the A.1 wrapper cell 814 and the global scan wire 826, and an A.2 SI select input 838. The output of the A.2 SI multiplexer 836 is connectable to the A.2 wrapper cell 816. The A.2 wrapper cell 816 is connectible to the A.2 internal scan chain 824.

The A.2 SO mapping logic 840 consists of a multiplexer with two inputs from the output of the A.1 internal scan chain 822 and the output of the A.2 internal scan chain 824, and an A.2 select B input 842. An A SO mapping logic 844 consists of an A multiplexer 846, and an ASIC multiplexer 848. The A multiplexer 846 has two inputs, the output of the A.2 SO mapping logic 840 and the output of the A.2 wrapper cell 816, and an A select A input 850.

The ASIC multiplexer 848 has two inputs, the output of the A wrapper cell 812 and the output of the A multiplexer 846, and an A select B input 852. The output of the ASIC multiplexer 848 is also the output of the A SO mapping logic 844 and contacts to the chip SO port 820.

Figure 9:
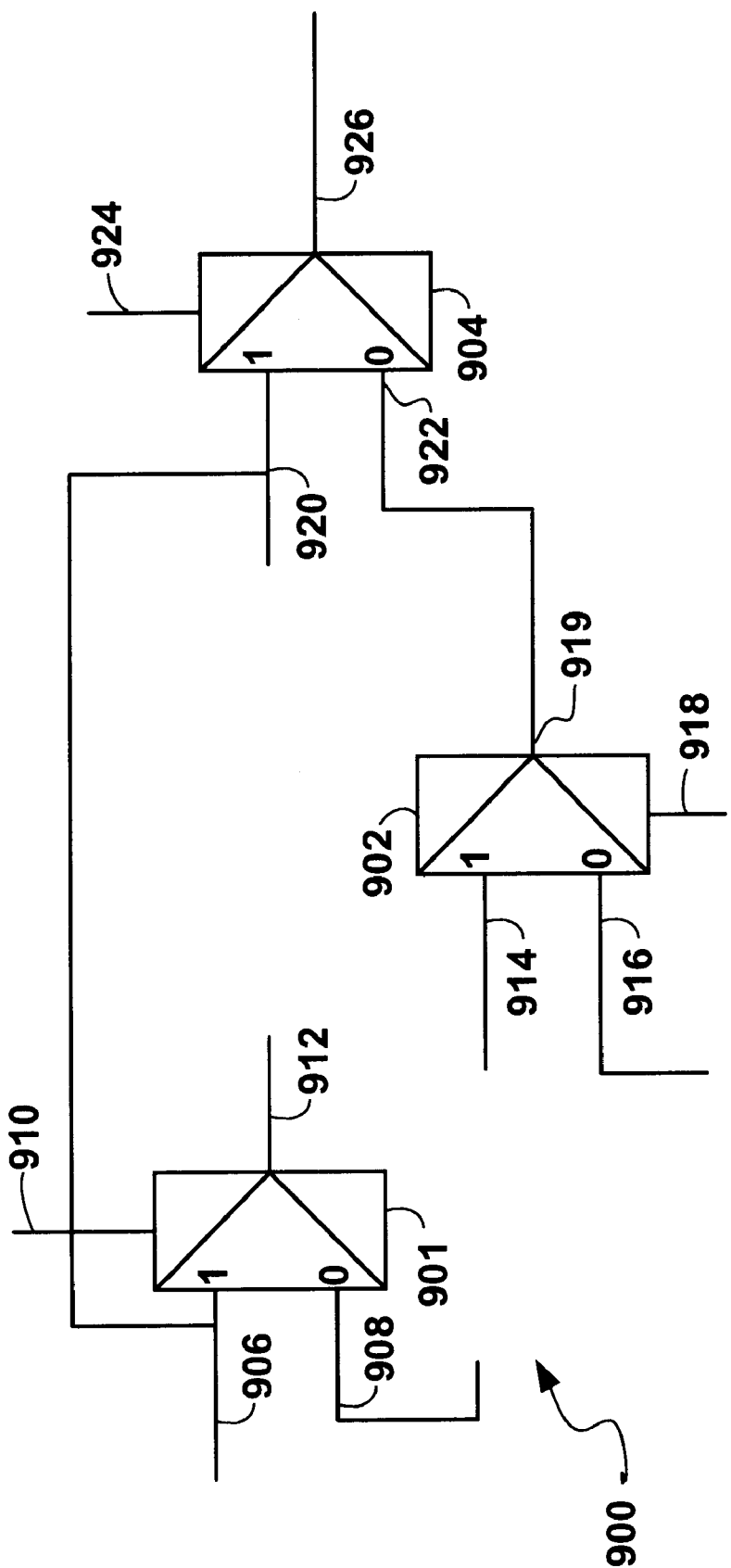
FIG. 9 is an alternate embodiment of the present invention using scan-out multiplexers.

Referring now to FIG. 9, therein is shown an alternate embodiment of the present invention using scan-out multiplexers. The reconfigurable scan path structure 900 includes three multiplexers, a host SI multiplexer 901, a nested-SO multiplexer 902, and a bypass multiplexer 904. The host SI multiplexer 901 has a first input from a host SI terminal 906 and a second input from a host internal scan chain 908. The host SI multiplexer 901 has an output to a nested SI input 912 and a SI select input 910. A nested-SO multiplexer 902 has a first input from a host SO wrapper cell 914 and a second input from a nested mapped SO logic 916 or a host SO internal core chain if no nested core exists. The nested-SO multiplexer 902 has a nested SO select input 918 signal and a nested-SO multiplexer output 919. The bypass multiplexer 904 also has inputs from host SI terminal 920 and the nested-SO multiplexer output 919. It is controlled by a bypass control input 924 and its output is a mapped host SO signal 926.

Figure 10:
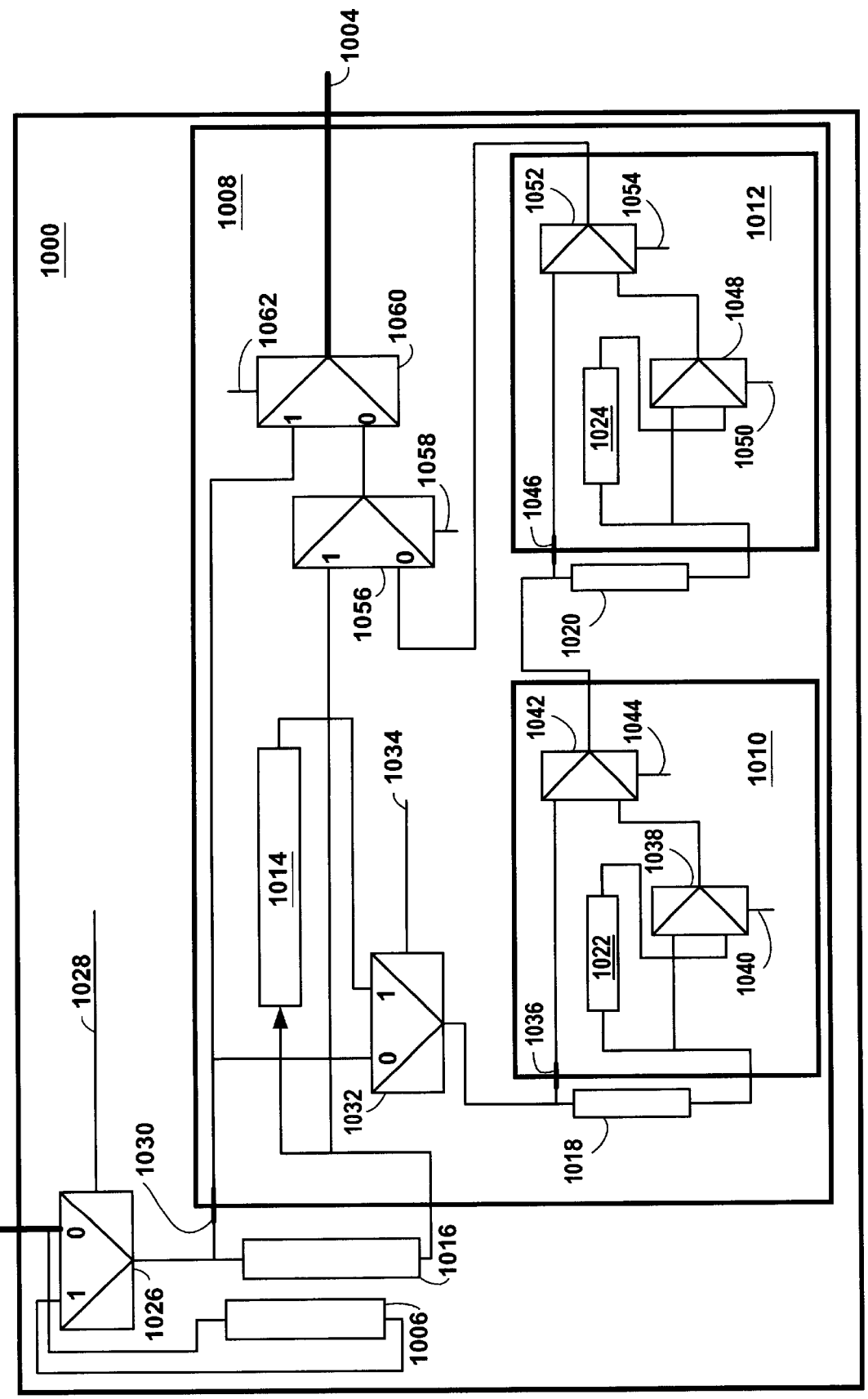
FIG. 10 is how the structures of FIGS. 8 and 9 are used in an integrated circuit of the present invention.

Referring now to FIG. 10, therein is shown how the scan test multiplexer structure 900 of FIG. 9 is incorporated on an ASIC chip with multiplexers and without a global SI bus wire routed through the embedding hierarchy. The ASIC chip 1000 has a chip SI port 1002, a chip SO port 1004, an ASIC chain 1006, and an A core 1008. The A core 1008 has two sub-cores, A.1 and A.2 sub-cores 1010 and 1012, and an A internal scan chain 1014. The A core 1008 has an A wrapper cell 1016 and each of the sub-cores has a wrapper cell. A.1 wrapper cell 1018 and A.2 wrapper cell 1020. Additionally, each sub-core has an internal scan chain, A.1 and A.2 internal scan chains 1022 and 1024.

The above elements are connected together by multiplexers which perform the mapping logic function. The chip SI port 1002 acts as an input to both the ASIC chain 1006 and an ASIC SI select multiplexer 1026. The ASIC SI select multiplexer SI select multiplexer 1026 inputs are connectable to the output of the ASIC chain 1006 and the chip SI port 1002 and it is controlled by an ASIC SI select input 1028. The output of the ASIC SI select multiplexer 1026 is connectable to both an A wrapper cell 1016 and an A SI terminal 1030. The A wrapper cell 1016 is connectable to an A internal scan chain 1014 which in turn has its output used as an input to an A SI multiplexer 1032. The other input of the A SI multiplexer 1032 is connectable to an A SI terminal 1030. The A SI multiplexer 1032 is controlled by an A SI select input 1034 and outputs to both an A.1 wrapper cell 1018 and an A.1 SI terminal 1036.

The A.1 wrapper cell 1018 is the input to an A.1 internal scan chain 1022 and an A.1 nested-SO multiplexer 1038. The A.1 nexted-SO multiplexer 1038 also has the output of the A.1 internal scan chain 1022 as an input and is controlled by the A.1 SO select input 1040. Both the outputs of the A.1 nested-SO multiplexer 1038 and the A.1 SI terminal 1036 act as inputs to a A.1 bypass multiplexer 1042 which is controlled by an A.1 bypass select input 1044. The output of the A.1 bypass multiplexer 1042 connects to the A.2 wrapper cell 1020 and an A.2 SI terminal 1046.

The A.2 wrapper cell 1020 is the input to the A.2 internal scan chain 1024 and the A.2 nested-SO multiplexer 1048. The A.2 nested-SO multiplexer 1048 also has the output of the A.2 internal scan chain 1024 as an input and is controlled by the A.2 SO select input 1050. Both the output of the A.2 nested-SO multiplexer 1048 and the A.2 SI terminal 1046 act as inputs to the A.2 bypass multiplexer 1052 which is controlled by an A.2 bypass select input 1054. The output of the A.2 bypass multiplexer 1052 exists the A.2 sub-core 1012 and connects to an A nested-SO multiplexer 1056.

The A nested-SO multiplexer 1056 also has the A wrapper cell 1016 as an input is controlled by the A SO select input 1058. The A nested-SO multiplexer 1056 is connectable to an A bypass multiplexer 1060. The A bypass multiplexer 1060 also has the A SI terminal 1030 as an input and is controlled by an A bypass select input 1062. The output of the A bypass multiplexer 1060 is connectable to the ASIC chip SO port 1004.

Figure 11:
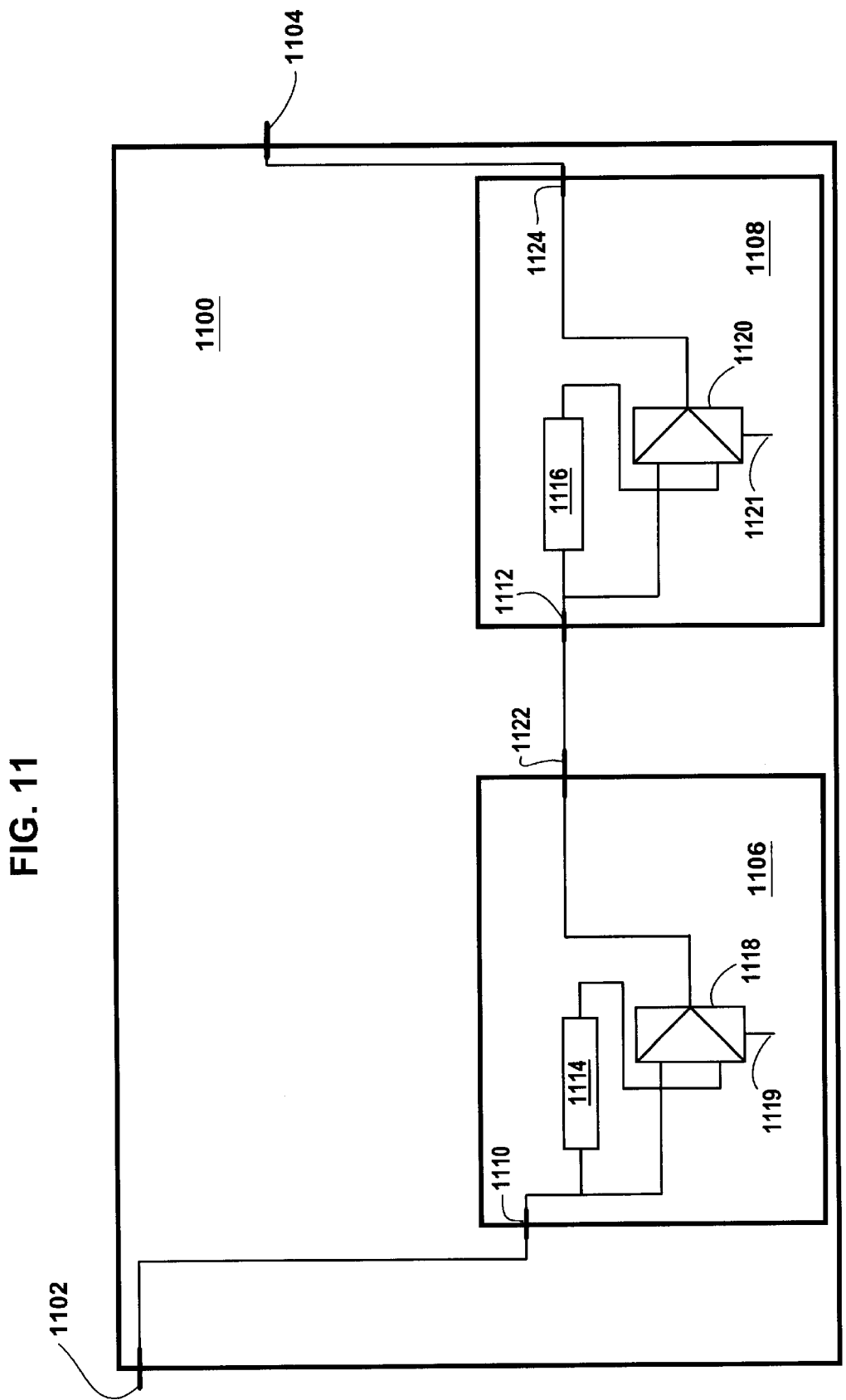
FIG. 11 is a further alternate embodiment of the present invention.

Referring now to FIG. 11, therein is shown a further alternate embodiment of a basic structure of the present invention incorporated on an ASIC chip 1100. The ASIC chip 1100 has an ASIC SI port 1102, an ASIC SO port 1104, an A core 1106, and a B core 1108. The A and B cores 1106 and 1108 have respective A and B SI terminals 1110 and 1112, A and B internal scan chains 1114 and 1116, A and B multiplexers 1118 and 1120, and A and B SO terminals 1122 and 1124.

The above elements are connected together serially. The chip SI port 1102 is connectable to the A SI terminal 1110 which is connectable to the A internal scan chain 1114 and the A multiplexer 1118 having an A select input 1119. The output of the A multiplexer 1118 is connectable to the A SO terminal 1122. The A SO terminal 1122 is connectable to the B SI terminal 1112.

The B SI terminal 1112 is connectable to the B internal scan chain 1116 and the B multiplexer 1120 have a B select input 1121. The output of the multiplexer 1120 is connectable to the B SO terminal 1124. The B SO terminal 1124 is connectable to the chip SO port 1104.

Operations:

FIG. 1 (PRIOR ART) shows the basic organization of the ASIC chip 100 which is subject to the prior art problem of the available scan ports at the chip boundary being exceeded by the total number of scan paths requiring access to these ports. The ASIC chip 100 has two chip SI ports 110 and two chip SO ports 128. However, there are seven scan paths required. The first two are from the chip SI ports 110 to the A SI terminals 112 and then from the A SO terminals 120 to the chip to the chip SO ports 128. A second set of two is from the chip SI ports 110 to the B SI terminals 114 and from the B SO terminal 126 to the chip SO ports 128. A third set of two scan paths is from the chip SI ports 110 to the B.2 SI terminals 118 and from the B.2 SO terminal 124 to the chip SO ports 128. The seventh scan path is from the chip SI ports 110 to the B.1 SI terminal 116 and from the B.1 SO terminal 122 to the chip SO ports 128.

Testing of an SLI device, such as the ASIC chip 100, involves isolating cores and sub-cores from the logic normally interacting with them and testing each as an entity. This isolation can include isolating a target core from child cores nested within it.

Relative to a core or sub-core embedded in the hierarchy, two basic test modes are required: (1) logic external to a core must be tested, and (2) the core itself must be tested. The testing of the logic external to a core is further categorized as (1) test parent logic, (2) test nesting logic, and (3) test of other cores.

Test of the core requires scan access to its wrapper cell, internal scan chains, and control registers, and the wrapper cells of the immediate child cores. The scan access involves logically configuring the ASIC chip such that the above-mentioned chains are loaded from the SI ports/terminals and unloaded for observation at the SO ports/terminals. Thus, a test of a core 200 would require scan access to the wrapper cells 214A through 214Z, the internal scan chains 210 and 212, and the control register 208. The loading would occur from the core SI terminals 202 and unloaded for observation at the core SO terminals 204.

During test or reconfiguration, adjustment of active scan chain lengths and components may become necessary. This is desirable, for instance, to facilitate efficient use of tester memory (not shown). Adjusting the lengths and components of scan paths requires that chain segments (e.g., wrapper cells, ASIC chains, core chains) be conditionally joined depending on the core or level of hierarchy being tested. Each section of logic tested may require a different concatenation of chain segments. After this conditional joining, core SI and SO terminals are mapped to the resulting targeted scan path for communication of test data.

For example, in FIG. 3A, the ASIC chip 300 has one ASIC chip SI port 318 and one ASIC chip SO port 320. A test of A core 304 has the internal scan chain 310, the A wrapper cell 312, the nested A.1 wrapper cell 314, and the A.2 wrapper cell 316 merged into a single scan chain outputting through ASIC SO terminal 320.

In FIG. 3B when testing A.1 sub-core 306, the scan chain of FIG. 3A is broken and a new active scan path is formed. The new scan path is from chip SI port 318 to the A.1 wrapper cell 314 to the A.1 internal scan chain 322 and out to the chip SO port 320.

In FIG. 3C, when testing the top level ASIC logic, the previous logical linkage is broken and a new scan path is formed. The new scan path shown in FIG. 3C is from the chip SI port 318 to the ASIC scan chain 302 to the A wrapper cell 312 and then to the chip SO port 320.

For scan testing, it is also desirable of having the capability of breaking scan chains into segments. In FIG. 3D, the ASIC chip 350 is shown with the chip SI1 and SI2 ports 376 and 378 and the chip SO1 and SO2 ports 380 and 382. Tester memory and admissible test time are usually limited. Thus, when possible, it is desired to partition the test data so it can be delivered across as many scan ports as the design can permit. This degree of parallelism reduces the test time compared to using a single test channel. However, tester memory is wasted if the scan data at each scan path is not balanced to be of equal length. In FIG. 3D, a scan path organization is shown where the A core 354 is provided with internal scan chains 360 and 362. Here the benefit of having the capability of breaking scan chains into segments is apparent. When scan testing A core 354, the SI1 and SI2 ports 376 and 378 can access two balanced scan paths if the A wrapper cell 312 were designed as two segments, wrapper cell segments 364 and 366. The internal scan chains are usually balanced by design.

There are two main techniques for constructing reconfigurable scan paths for a SL1 ASIC chip where the number of scan chains exceeds the number of SI or SO terminals. The reconfigurable scan path structures are used to map a chip SI port to the core SI terminal of a targeted scan chain and to map a chip SO port to the SO terminal of the targeted scan chain. The following is based on a single SI port and a single SO port, but multi-port configurations would be obvious to those skilled in the art.

One technique for constructing reconfigurable scan paths is where a global SI bus exists. A global SI bus connects the chip SI port to each core or sub-core requiring scan access. The reconfigurable scan path structure 400 of FIG. 4 would be replicated along the global SI bus.

Thus, each wrapper cell segment, which can be merged, has a multiplexer. In this manner, the scan-input of the host wrapper cell 408 can be logically attached to the global SI bus or to the scan-out of another scan chain, such as the header scan chain 402. The header scan chain 402 can be one level of integration higher than that of the core isolated by the host wrapper cell 408. Thus, the input from the header scan chain 402 facilitates testing of parent logic to the isolated core. The output of the wrapper cell 408 can be connectable to the SI terminal of another scan chain, such as another wrapper cell segment of the same level or an internal scan chain of the core associated with the wrapper cell. The output of the host wrapper cell 408 can also be logically attached to a core SO or mapped to a chip SO port via multiplexing logic.

An example of this would be a test of A core 502 in ASIC chip 500, the A wrapper cell 516 and the A internal scan chain 520 should be merged into a single scan path. During test of the surrounding ASIC logic, the ASIC multiplexer 512 connects the chip scan chain 510 to the A wrapper cell 516. The output of the A wrapper cell 516 is directly connectable to the SO mapping logic 518 and through the internal scan chain 520 and outputs to the chip SO port 506. The SO mapping logic 518 can logically connect an active scan chain to a predetermined chip SO port so the scan-out is "mapped" to the chip SO port. Each SO mapping logic is local to the core and is part of a distributed multiplexing/mapping network dedicated to the specified chip port. Therefore, the number of such networks is at most the number of chip scan-out ports available.

At A core 502, the SO mapping logic 518 is essentially multiplexing such as provided by the multiplexer 602 in FIG. 6. The multiplexer 602 provides the ability to select from among the scan-outs of the scan path configured when testing the host core itself, the mapping SO of a nested mapping sub-network, the scan path at the top level surrounding the core, and the mapped SO of a previous core along the mapping path. The chosen SO signal is logically connectable to one of the core's SO terminals for eventual mapping to a chip SO port. The SO mapping logic is flexible and the multiplexing function can be reduced if one or more of the incoming SO connections are not required. The user defines connectivity and style used for the SO mapping path of the chip, the select inputs in coding impact both the actual implementation of the mapping logic and the particular test mode states assigned to the cores during the test.

The select inputs allow the connectivity of the SO mapping logic to fall into a number of categories depending on how many connections are required as indicated by the multiplexer 602 of FIG. 6. The first is the SO chip chain where the chip chain is merged with the wrapper cells of the cores at the first level of embedding relative to the top chip level. The merge is such that the wrapper cell is at the tail of the joined scan chain. The second is the SO nest network where given a core, the final mapped SO of the network of child cores embedded at a single level downward connects to the "nest network SO" terminal of the host mapping logic. The third is the SO chain/SO wrapper cell 608 where cores with the same immediate parent are "daisy-chained" so that the mapped SO of the core is connected to the "previous core" terminal of the successor core's mapping logic. The fourth is the SO of the scan path configured when testing the host core.

The SO mapping logic 518 of FIG. 5 is essentially a simpler multiplexing logic providing the ability to select from among the scan paths through the chip chain 510, the A wrapper cell 516, or the A wrapper cell 516 and the A internal scan chain 520.

For more complex logic, the SO mapping logic such as the SO mapping logic 600, which may be a plurality of individual multiplexers, provides the ability to select from among the scan-outs of the scan paths configured at the parent level surrounding the core, the mapped SO of a nested mapping sub-network, the mapped SO of a previous core along the mapping path, or the scan-out of the scan path configured when testing the host core itself. These are respectively designated as the ASIC chain/SO wrapper cell input 608, the nest network SO input 610, the previous core SO input 612, and the host core SO input 614. The chosen SO is logically connectable to one of the core's SO terminals for eventual mapping to a chip SO port.

The SO mapping logic is flexible and the multiplexing function can be reduced if one or more of the incoming SO connections are not required. The user-defined connectivity style used for the SO mapping paths of the chip, due to the control signal encoding, impacts both the actual implementation of the mapping logic and the particular test modes states assigned to the cores during test.

For test of the ASIC logic, the ASIC scan chain is merged with the wrapper cells of cores at the first level of embedding relative to the top ASIC level. The merge is such that the wrapper cell is at the tail of the join scan chain. This SO wrapper cell is connectable to the ASIC chain/SO wrapper cell 608 of the mapping logic of a core at the first level of integration. The SO mapping path (i.e., a destination chip SO port) targeted by that mapping logic can not be used by any other ASIC scan chain connection.

The SO nest network is connectable to the final mapped SO of the network of child cores embedded at a single level downwards.

The SO of the previous core 612 is connectable to the mapped SO of a previous core with cores having the same immediate parent "daisy-chained". The host core SO input 614 comes directly from the SO mapping logic of the core itself.

FIG. 7 shows examples of the transversals of the SO mapping paths of the SO mapping logic. An example of the ASIC chain/SO wrapper cell 608 of FIG. 6 would be the ASIC scan chain 704 mapped through the SO mapping logic 720. An example of the nest network SO input 610 of FIG. 6 would be A.2 internal scan chain 714 mapped through A.2 SO mapping logic 718 to the A SO mapping logic 720. An example of the previous core SO input 612 of FIG. 6 would be the A.1 SO mapping logic 716 connectable to the A.2 SO mapping logic 718 to the A SO mapping logic 720. An example of the host core SO input 614 of FIG. 6 would be the A internal scan chain 710 connection to the A SO mapping logic 720.

FIG. 8 shows the reconfigurable scan path structure 400 in conjunction with the ASIC chip 800. As an example of operation, in testing A.2 sub-core 808, the A.2 SI multiplexer 836 is selected to choose the input from the global scan bus 826 which would load the A.2 wrapper cell 816 and then the A.2 internal scan chain 824. The A.2 internal scan chain 824 then feeds into the A.2 SO mapping logic 840. The A.2 SO mapping logic 840 selects the connection to the A.2 internal scan chain 824. The A.2 SO mapping logic 840 provides the output to the A SO multiplexer 846 in the SO mapping logic 844. In the A SO mapping logic 844, the multiplexer 846 is selected to provide the output from the A.2 SO mapping logic 840 to the ASIC multiplexer 848 which is selected to output to the chip SO port 820.

Similarly, in testing A.1 sub-core 806, the scan path to be loaded and probed is that formed by A.1 wrapper cell 814 and the A.1 internal scan chain 822. The A.1 SI multiplexer 832 is controlled to select the goal scan bus 826. The control signals required at the various select inputs of the multiplexers would be evident to those skilled in the art.

The second technique for constructing reconfigurable scan paths defines a multiplexing organization local to a core. The defined structure is also connectable throughout the ASIC chip to act as part of a global SO mapping network for a scan path which can be logically connectable to it. Although, the preferred embodiment is somewhat rigid in connectivity, the technique maintains a high degree of flexibility in the manner in which scan paths can be configured. There is also no need for a global SI bus. In this technique, the SI data is logically mapped to a scan chain via the mapping logic. The path used to transmit SI data is the same as that used to map SO data. In addition, the mapping path of the SO of a core's active scanning chain is through the core's nested children (as opposed to a possible direct connection to the core's SO mapping logic, as in the previous technique). The conditional merging of wrapper cell chains during core test and the test of surrounding parent logic is also done via the mapping logic. Because of this, some of the header multiplexers can be eliminated as compared to the previous technique.

Depending on the number of input signals available to the reconfigurable scan path structure 900 of FIG. 9, the actual multiplexing function can be simplified.

In FIG. 9, the reconfigurable scan path structure 900 defines a multiplexing organization which is local to a core. It is connectable in different locations throughout a chip to act as part of a global scan output mapping network for any scan path which can be logically connected to it.

Instead of requiring a global scan input bus as previously described, the scan in data is also logically mapped to a scan chain by the mapping logic. Thus, the scan path used to transmit the scan in data or information is the same as that used to map the scan out signals. In addition, the mapping path of the scan out data or information of an active scan chain of a core is through the nested children of the core. The conditional merging of wrapper chains during core-test and test of surrounding parent logic is also performed by the mapping logic. This allows elimination of a number of the header multiplexes as required in the previously described system.

FIG. 10 is an example of the structure of the reconfigurable scan path structure 900 of FIG. 9 applied to an ASIC chip 1000. The ASIC chip 1000 has three cores in which the A core 1008 is a child of the first level embedding into the ASIC 1000, and the A.1 and A.2 sub-cores 1010 and 1012 are nested within A core 1008. In testing the A core 1008, in the case of this figure, the aim is to load the A wrapper cell 1016, the A internal scan chain 1014, and the A.1 and A.2 wrapper cell 1018 and 1020. The multiplexers involved are the ASIC SI select, A bypass, A nested-SO, and A SI multiplexers, 1026, 1060, 1056, and 1032, respectively. The ASIC SI select multiplexer 1026 selects between the chip SI port 1002 and the output of the ASIC internal scan chain 1006, choosing the first input in this case. The output of the ASIC SI select multiplexer 1026 is connected both the A SI terminal 1030 and the input of the A wrapper cell 1016. The A wrapper cell 1016 is connected to the A internal scan chain 1014 which in turn acts as an input to the A SI multiplexer 1032. The A SI multiplexer 1032 selects between the input of A SI terminal 1030 and the A internal scan chain 1014, choosing the second input in the test of A core 1008. The output of the A SI multiplexer 1032 loads the sub-core A.1 wrapper cell 1018. The A.1 wrapper cell 1018 is selected and passed through the A.1 nested-SO multiplexer 1038. The output of the A.1 nested-SO multiplexer 1038 is then selected by the A.1 bypass multiplexer 1042. The A.2 wrapper cell 1020 is connectable to the A.1 bypass multiplexer 1042 to provide the test data into the A.2 sub-core 1012. The A.2 wrapper cell 1020 is connectable to the A.2 nested-SO multiplexer 1048 which provides an output to the A.2 bypass multiplexer 1052.

The A nested-SO multiplexer 1056 is selected to provide the output of the A.2 bypass multiplexer 1052 to the A bypass multiplexer 1060, which controls the chip SO port 1004.

FIG. 11 shows the A and B multiplexers 1118 and 1120 connected in the simplest configuration such that the ASIC SI port 1102 is connectable directly to the A SI terminal 1110 and to the A internal scan chain 1114 to the A multiplexer 1118. The output of the A multiplexer 1118 is provided to the B SI terminal 1122 and directly to the B SI terminal 1112. From the B SI terminal 1112 the test data is provided to the B internal scan chain 1116 and then to the B multiplexer 1120 and from there to the B SO terminal 1124 and from there to the ASIC port 1104. This permits scanning each of the internal scan chains 1114 and 1116 individually or in combination.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirity and scope of the included claims. All matters set forth herein or shown in the accompanying drawings are to be interpreted in an illustrative and non-limiting sense.

The invention claimed is:

1. An integrated circuit chip having a select control, comprising:
   a scan-in terminal;
   a scan-out terminal;
   a first scan element connectable to the scan-in terminal;
   a second scan element connectable to the scan-out terminal;
   a core scan element having the first and second scan elements nested therein and connectable to the scan-in terminal; and
   connection logic controlled by the select control, the connection logic in a first selection connecting the first scan element to the scan-output terminal, the connection logic in a second selection connecting the second scan element to the scan-in terminal, the connection logic in a core scan element selection connecting the third scan element to the first and second scan elements.

2. The integrated circuit as claimed in claim 1 wherein:
   the connection logic in a third selection connects the scan-in terminal through the first and second scan elements to the scan-out terminal.

3. The integrated circuit as claimed in claim 1 wherein:
   the connection logic in a third selection bypasses the first and second scan elements to directly connect the scan-in and scan-out terminals.

4. The integrated circuit as claimed in claim 1 wherein:
   the scan-in terminal, the scan-out terminal, and the connection logic in the first and second selections defines respective first and second scan paths for scan testing, the first and second scan paths being balanced to take substantially equal time for scan testing.

5. The integrated circuit as claimed in claim 1 including:
   a global bus connectable to the scan-in terminal;
   a terminal scan element connectable to the global bus; and
   mapping logic connectable to the third scan element, the mapping logic in a first selection and a second selection respectively connecting the third and second scan elements to the scan-out terminal.

6. The integrated circuit as claimed in claim 1 including:
   a third scan element connectable to the scan-out terminal;
   bypass logic controlled by the select control and connectable to the scan-in terminal, the bypass logic in a first selection connecting the scan-in terminal to the scan-out terminal;
   scan-out logic controlled by the select control and connectable to the bypass logic, the scan-out logic in a first and second selections respectively connecting the third and second scan elements to the scan-out terminal; and
   the bypass logic in a second selection connecting the scan-out logic to the scan-out terminal.

7. An integrated circuit chip having a select control, comprising:
   a chip scan-in port;
   a chip scan-out port;
   a first sub-core having:
      a first scan-in terminal connectable to the chip scan-in port;
      a first scan-out terminal;
      a first wrapper cell connectable to the first scan-in and scan-out terminals; and
      first connection logic controlled by the select control, the first connection logic in a first selection connecting the first scan-in and scan-out terminals and in a second selection to connecting the first wrapper cell to the first scan-out terminal;
   a second sub-core having;
      a second scan-in terminal connectable to the first scan-out terminal;
      a second scan-out terminal connectable to the chip scan-out port;
      a second wrapper cell connectable to the second scan-in and scan-out terminals; and
      second connection logic controlled by the select control, the second connection logic in a first selection connecting the first wrapper cell to the scan-output terminal, the connection logic in a second selection connecting the second wrapper cell to the scan-out terminal; and
   a core having the first and second sub-cores nested therein and having:
      a core wrapper cell connectable to the chip scan-in port; and
      core connection logic controlled by the select control, the core connection logic in a core selection connecting the core wrapper cell to the first and second scan-in terminals.

8. The integrated circuit as claimed in claim 7 wherein:
   the first and second connection logic in a third selection connects the scan-in port through the first and second wrapper cells to the scan-out port.

9. The integrated circuit as claimed in claim 7 wherein:
   the first and second connection logic in a third selection by passes the first and second wrapper cells to directly connect the scan-in and scan-out ports.

10. The integrated circuit as claimed in claim 7 wherein:
    the scan-in port, the scan-out port, and the first and second connection logic in the first and second selections define respective first and second scan paths for scan testing, the first and second scan paths being balanced to take substantially equal time for scan testing.

11. The integrated circuit as claimed in claim 7 including:

a global bus connectable to the scan-in port;

a third wrapper cell connectable to the global bus; and mapping logic connectable to the third wrapper cell, the mapping logic in a first selection and a second selection respectively connecting the third and second wrapper cells to the scan-out port.

12. The integrated circuit as claimed in claim 7 including:

a third wrapper cell connectable to the scan-out port;

bypass logic controlled by the select control and connectable to the scan-in port, the bypass logic in a first selection connecting the scan-in port to the scan-out port;

scan-out logic controlled by select control and connectable to the bypass logic, the scan-out logic in a first and second selections respectively connecting the third and second wrapper cells to the scan-out port; and the bypass logic in a second selection connecting the scan-out logic to the scan-out port.

13. An integrated circuit having a select control, comprising:

a host core;

a child core in the host core;

a scan-in terminal in the host care;

a host core scan element connectable to the scan-in terminal;

scan-in connection logic connectable to the scan-in terminal and the host core scan element;

a child scan element connectable to the scan-in logic;

an internal child scan element in the child core connectable to the scan-in logic; and connection logic responsive to the select control and connectable to the child scan element and the internal child scan element.

14. The integrated circuit as claimed in claim 13 including:

a parent core containing the host core and a scan-out terminal;

a parent core scan element in the parent core; and scan-out mapping logic responsive to the select control and connectable to the mapping logic for selectivity connecting the parent, host, and child scan elements to the scan-out terminal.

15. The integrated circuit as claimed in claim 13 including:

a nested core in the host core;

a nested scan element in the nested core;

a nested mapping logic responsive to the select control and connectable to the nested core scan element; and the scan-out mapping logic for selectively connecting the nested core scan element to the scan-out terminal.

16. The integrated circuit as claimed in claim 13 including:

a sub-core in a child core;

a sub-core scan element in the sub-core;

a sub-core mapping logic responsive to the select control and connectable to the sub-core scan element; and the scan-out mapping logic for selectively connecting the sub-core scan element to the scan-out terminal.

17. The integrated circuit as claimed in claim 13 including:

a nested core in the host core;

a nested scan element in the nested core;

the connection logic connectable to form two scan paths through the child and nested scan element from the scan-in terminal to the scan-out terminal taking equal time to scan.

18. The integrated circuit as claimed in claim 13 including:

bypass connections connectable to the mapping logic for bypassing the hosts and child scan elements.

19. An integrated circuit having a select control, comprising:

a chip scan-in port;

a global bus connectable to the chip scan-in port;

a scan-in multiplexer responsive to the select control and connectable to the global bus;

a chip scan chain connectable to the global bus and the scan-in multiplexer;

a parent core;

a parent wrapper cell connectable to the scan-in multiplexer;

a parent scan chain connectable to the core wrapper cell;

a child core in parent core;

a child multiplexer responsive to the select control and connectable to the global bus and to the core scan chain;

a chain wrapper cell connectable to the child multiplexer;

a child scan chain in the child core connectable to the child wrapper cell;

a nested core in the parent core;

a nested multiplexer responsive to the select control and connectable to the global bus and to between the child wrapper cell and the child scan chain;

a nested wrapper cell connectable to the nested multiplexer;

a nested scan chain in the nested core connectable to the nested wrapper cell;

child mapping logic responsive to the select control and connectable to the child and nested scan chains;

a first scan-out multiplexer responsive to the select control and connectable to the nested mapping logic and to between the nested wrapper cell and the nested scan chain; and a second scan-out multiplexer responsive to the select control and connectable to the scan-out port, to the first scan-out multiplexer, and to between the parent wrapper cell and the parent scan chain.

20. An integrated circuit having a select control, comprising:

a chip scan-in port;

a scan-in multiplexer responsive to the select control and connectable to the scan-in port;

a chip scan chain connectable to the scan-in port and the scan-in multiplexer;

a core wrapper cell connectable to the scan-in multiplexer;

an integrated circuit core;

a core scan chain connectable to the core wrapper cell;

a child core in the integrated circuit core;

a child multiplexer responsive to the select control and connectable to the scan-in port and to the core scan chain;

a child wrapper cell connectable to the child multiplexer;

a child scan chain in the integrated circuit core connectable to the child wrapper cell;

a nested core in the integrated circuit core;

a nested multiplexer responsive to the select control and connectable between the child wrapper cell and the child scan chain and connectable to the scan-input port;

a nexter wrapper cell connectable to the nested multiplexer;

a nested scan chain in the integrated circuit core and connectable to the nested wrapper cell;

a mapping logic responsive to the select control and connectable to the child scan chain and to the nested scan chain;

a first scan-out multiplexer responsive to the select control and connectable to between the nested wrapper cell and the nested scan chain and to mapping logic; and a second scan-out multiplexer responsive to the select control and connectable between the core wrapper cell and the core scan chain and to the first scan-out multiplexer and the scan-out port.

21. An integrated circuit chip having a select control, comprising:

a scan-in terminal;

a scan-out terminal;

a first scan element connectable to the scan-in terminal;

a second scan element connectable to the scan-out terminal;

a core scan element having the first and the second scan elements nested therein; and connection logic controlled by the select control, the connection logic in a first selection connecting the first scan element to the scan-output terminal, the connection logic in a second selection connecting the second scan element to the scan-in terminal; the connection logic in a core selection connecting the core scan element to the first and second scan elements.

22. An integrated circuit chip having a scan test path, comprising:

a scan-in terminal;

a core wrapper cell connected to the scan-in terminal;

a core including:
   a core internal scan chain connected to the core wrapper cell,
   a first sub-core wrapper cell connected to the core internal scan chain,
   a second sub-core wrapper cell connected to the first sub-core wrapper cell;

a scan-out terminal connected to the second sub-core wrapper cell whereby a scan test path extends from the scan-in terminal to the core wrapper cell to the core internal scan chain to the first sub-core wrapper to the second sub-core wrapper to the scan-out terminal.

23. An integrated circuit chip having a scan test path, comprising:

a scan-in terminal;

a sub-core wrapper cell connected to the scan-in terminal;

a sub-core including:
   a sub-core internal scan chain connected to the sub-core wrapper cell and to the scan-out terminal; and
   a scan-out terminal connected to the internal scan chain whereby a scan test path extends from the scan-in terminal to the sub-core wrapper cell to the sub-core internal scan chain to the scan-out terminal.

24. An integrated circuit chip having a scan test path, comprising:

a scan-in terminal;

a core wrapper cell connected to the scan-in terminal; and a scan-out terminal connected to the core wrapper cell whereby a scan test path extends from the scan-in terminal to the core wrapper cell to the scan-out terminal.

25. An integrated circuit chip having a scan test path, comprising:

a scan-in terminal;

a first core wrapper segment cell connected to the scan-in terminal;

a first core wrapper segment cell connected to the scan-in terminal in parallel with the first core wrapper segment cell;

a first core internal scan chain connected to the first core wrapper segment cell;

a second core internal scan chain connected to the second core wrapper segment cell;

a first sub-core wrapper cell connected to the first core internal scan chain;

a second sub-core wrapper cell connected to the second core internal scan chain; and a plurality of scan-out terminals respectively connected to the first and second sub-core wrapper cells whereby two scan test paths extend from the scan-in terminal to respective first and second core wrapper segment cells to respective first and second core internal scan chains to respective first and second sub-core wrapper cells to the plurality of scan-out terminals.

* * * * *